(12) United States Patent
Schlosser et al.

(10) Patent No.: US 9,966,516 B2
(45) Date of Patent: May 8, 2018

(54) LIGHTING DEVICE AND METHOD FOR PRODUCING SUCH A LIGHTING DEVICE

(71) Applicant: OSRAM Opto Semiconductors GmbH, Regensburg (DE)

(72) Inventors: Philipp Schlosser, Regensburg (DE); Andreas Waldschik, Wolmirstedt (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days. days.

(21) Appl. No.: 15/503,028

(22) PCT Filed: Jul. 20, 2015

(86) PCT No.: PCT/EP2015/066535
§ 371 (c)(1),
(2) Date: Feb. 10, 2017

(87) PCT Pub. No.: WO2016/023709
PCT Pub. Date: Feb. 18, 2016

(65) Prior Publication Data
US 2017/0244011 A1 Aug. 24, 2017

(30) Foreign Application Priority Data
Aug. 12, 2014 (DE) .................... 10 2014 215 939

(51) Int. Cl.
*H01L 33/60* (2010.01)
*H01L 33/48* (2010.01)
(Continued)

(52) U.S. Cl.
CPC .......... *H01L 33/60* (2013.01); *H01L 25/0753* (2013.01); *H01L 33/486* (2013.01);
(Continued)

(58) Field of Classification Search
CPC ........ H01L 33/60; H01L 33/56; H01L 33/62; H01L 25/0753; H01L 33/502;
(Continued)

(56) References Cited

U.S. PATENT DOCUMENTS

2002/0187570 A1 12/2002 Fukasawa et al.
2010/0022039 A1* 1/2010 Chang ................. H01L 33/0095
438/28
(Continued)

FOREIGN PATENT DOCUMENTS

DE 102009036621 A1 2/2011
JP 2013251417 A 12/2013

OTHER PUBLICATIONS

German Search Report based on application No. 10 2014 215 939.3 (7 pages) dated Apr. 16, 2015.
(Continued)

*Primary Examiner* — David Vu
(74) *Attorney, Agent, or Firm* — Viering, Jentschura & Partner mbB

(57) ABSTRACT

A method for producing a lighting device is provided. According to the method, a plurality of semiconductor emitters arranged alongside one another are embedded in a light-transmissive filling compound apart from a side having their electrical connections, trenches are introduced into the light-transmissive filling compound at the side having the electrical connections between at least two semiconductor emitters, the side of the light-transmissive filling compound having the electrical connections, including the electrical connections, is covered with a dielectric material, electrical lines are led through the dielectric material to the electrical connections, and at least some of the trenches are severed.

20 Claims, 5 Drawing Sheets

(51) Int. Cl.
  *H01L 25/075* (2006.01)
  *H01L 33/50* (2010.01)
  *H01L 33/56* (2010.01)
  *H01L 33/62* (2010.01)
  *H01L 33/54* (2010.01)
(52) U.S. Cl.
  CPC ............ *H01L 33/502* (2013.01); *H01L 33/56* (2013.01); *H01L 33/62* (2013.01); *H01L 33/54* (2013.01); *H01L 2224/04105* (2013.01); *H01L 2224/18* (2013.01); *H01L 2933/005* (2013.01); *H01L 2933/0033* (2013.01); *H01L 2933/0058* (2013.01); *H01L 2933/0066* (2013.01)
(58) Field of Classification Search
  CPC ....... H01L 2933/0058; H01L 2933/005; H01L 2933/0066
  See application file for complete search history.

(56) References Cited

U.S. PATENT DOCUMENTS

| | | |
|---|---|---|
| 2012/0119233 A1 | 5/2012 | Weidner et al. |
| 2013/0062644 A1 | 3/2013 | Ushiyama |
| 2014/0175471 A1 | 6/2014 | Akimoto et al. |

OTHER PUBLICATIONS

International Search Report based on application No. PCT/EP2015/066535 (6 pages) dated Sep. 8, 2015.

* cited by examiner

LIGHTING DEVICE AND METHOD FOR PRODUCING SUCH A LIGHTING DEVICE

RELATED APPLICATIONS

The present application is a national stage entry according to 35 U.S.C. § 371 of PCT application No.: PCT/EP2015/066535 filed on Jul. 20, 2015, which claims priority from German application No.: 10 2014 215 939.3 filed on Aug. 12, 2014, and is incorporated herein by reference in its entirety.

TECHNICAL FIELD

Various embodiments relate to a method for producing a lighting device including a plurality of semiconductor emitters. Various embodiments also relates to a lighting device including at least one semiconductor emitter, wherein the lighting device has been produced by means of the method. The present disclosure is applicable, in particular, to LEDs as the semiconductor emitters. It is applicable, in particular, to surface and linear luminaires and/or replacement or retrofit lamps.

BACKGROUND

The emission characteristic of so-called "LED packages" or packaged LEDs is dependent on various geometrical and material-specific factors. Typically, at least one LED chip is adhesively bonded or soldered into a housing having four sides and a base and is connected to conductors leading toward the outside. The cavity or receptacle space which is formed by the housing and in which the at least one LED chip is situated is filled with converting and scattering materials. Depending on a type of the LED chip used and the materials introduced by filling, light emitted by the at least one LED chip impinges at specific angles on an inner side of the housing and is deflected from there or absorbed thereby, depending on the constitution of the inner side. The dimensions of the housing and the geometrical constitution thereof therefore directly influence the optical properties of the packaged LED, e.g. an emission angle and/or an angle dependence of a light color. If a large amount of light is absorbed by the housing, an efficiency decreases. These housings are usually produced in an injection molding method and therefore cause high costs for tools. Moreover, a shape of the housing cannot then be varied simply and rapidly.

SUMMARY

The object of the present disclosure is at least partly to overcome the disadvantages of the prior art and, more particularly, to provide a possibility for the inexpensive and simply and rapidly variable production of a housing for at least one semiconductor emitter, in particular LED chip. The LED chip may be a volume emitter, e.g. a sapphire chip, or a surface emitter.

This object is achieved in accordance with the features of the independent claims. Preferred embodiments can be gathered from the dependent claims, in particular.

The object is achieved by means of a method for producing a lighting device, wherein (i) a plurality of semiconductor emitters arranged alongside one another are embedded in a light-transmissive filling compound apart from a side having their electrical connections, (ii) trenches are introduced into the filling compound at the side having the electrical connections between at least two semiconductor emitters, (iii) a side of the filling compound having the electrical connections, including the electrical connections, is covered with a dielectric material, (iv) electrical lines are led through the dielectric material to the electrical connections, and (v) at least some of the trenches are severed.

This method affords the advantage of a cost saving by omission of production equipment such as an injection mold. Moreover, a high flexibility in production is achieved by a simply, inexpensively and rapidly implementable adaptability of a size of the parts singulated (e.g. with regard to their lateral extent and/or thickness) after the last step. Moreover, shape and size of housing-internal reflector surfaces can likewise be implemented inexpensively and rapidly. Furthermore, a separate carrier for the semiconductor emitters can be dispensed with since the latter are held by the filling compound on the dielectric material. Consequently, different emission properties can be adapted to different applications inter alia with low costs and high production flexibility.

The semiconductor emitter may be for example a light emitting diode or a laser, in particular laser diode. The semiconductor emitter may be present as a semiconductor chip, in particular as an LED chip or as a laser chip. If a plurality of semiconductor emitters are present, they can emit primary light of the same color or in different colors. A color can be monochromatic (e.g. red, green, blue, etc.) or multichromatic (e.g. white). Moreover, the light emitted by at least one semiconductor emitter can be an infrared light (IR LED), or an ultraviolet light (UV LED). A plurality of semiconductor emitters can generate a mixed light; e.g. a white mixed light. The at least one semiconductor emitter can contain at least one wavelength-converting phosphor (conversion semiconductor emitter). The phosphor can alternatively or additionally be arranged at a distance from the light emitting diode ("remote phosphor"), e.g. in the light-transmissive filling material. Instead of or in addition to inorganic light emitting diodes, e.g. on the basis of InGaN or AlInGaP, organic LEDs (OLEDs, e.g. polymer OLEDs) are generally usable as well.

In step (i) the semiconductor emitters may be arranged alongside one another in a regular pattern, e.g. in a matrix-shaped or hexagonal pattern.

In step (i) the semiconductor emitters may be arranged at an identical level. Alternatively, at least two semiconductor emitters may be arranged at different levels.

The light-transmissive filling compound may be a transparent (e.g. clear) or translucent or opaque (e.g. light-scattering) compound. The translucent filling compound may include a transparent basic or matrix material in which scattering particles are distributed. The scattering particles may be present in powder form. The scattering particles may be white and/or colored particles, in particular white pigments. Possible scattering particles may be present e.g. in the form of titanium oxide and/or aluminum oxide. The light-transmissive filling compound may also be referred to as "embedding compound".

The light-transmissive filling compound may include at least one phosphor. A phosphor is suitable for converting primary light emitted by the semiconductor emitters at least partly into secondary light having a different wavelength. If a plurality of phosphors are present, they may generate secondary light of mutually different wavelengths. The wavelength of the secondary light may be longer (so-called "down conversion") or shorter (so-called "up conversion") than the wavelength of the primary light. By way of example, blue primary light may be converted into green, yellow, orange or red secondary light by means of a phosphor. In the case of only partial wavelength conversion, the phosphor body emits a mixture of secondary light and non-converted primary light, which mixture can serve as useful light. By way of example, white useful light may be generated from a mixture of blue, non-converted primary light and yellow secondary light. However, a full conversion is also possible, in the case of which either the useful light is no longer present or only a negligible proportion thereof is present in the useful light. A degree of conversion is dependent for example on a thickness and/or a phosphor concentration of the phosphor. If a plurality of phosphors are present, secondary light components having different spectral compositions can be generated from the primary light, e.g. yellow and red secondary light. The red secondary light may be used for example to give the useful light a warmer hue, e.g. so-called "warm white". If a plurality of phosphors are present, at least one phosphor may be suitable for wavelength-converting secondary light again, e.g. green secondary light into red secondary light. Such a light wavelength-converted again from a secondary light may also be referred to as "tertiary light".

The phosphor can also be used as scattering material. The phosphor can be used in addition or as an alternative to dedicated scattering particles. The phosphor may be present as scattering particles, in particular in powder form. The phosphor may be distributed in an e.g. transparent matrix material.

The matrix material in which the scattering material and/or the phosphor are/is introduced may be or include silicone or epoxy resin, for example.

The filling compound may be, in particular, potting material or potting compound.

In one development, that side of a respective semiconductor emitter which has its electrical connections may be completely free of the filling compound. In other words, if e.g. all the electrical connections of a semiconductor emitter are arranged on one side (referred to hereinafter as "underside" without restricting the generality), in one development the entire underside, specifically including the electrical connections and the region between the electrical connections, is free of the filling compound. In another development, only the electrical connections of a respective semiconductor emitter are free of the filling compound. In this case, therefore, the region e.g. of the underside between the electrical connections is also occupied by the filling compound. The electrical connections can, in particular, terminate areally flush with the filling compound or project in an elevated manner from the filling compound. The electrical connections can also be referred to as "chip contacts".

The trenches are rectilinear trenches, in particular. They do not extend through the solidified filling compound at least in sections. A trench may have, in particular, an identical cross-sectional shape. The cross-sectional shape of a plurality of trenches may be identical or different. The trenches may run entirely through the filling compound longitudinally.

The trenches, in a plan view of their underside, may surround at least one group, in particular a plurality of groups, of semiconductor emitters. The at least one group may include one or a plurality of semiconductor emitters. A plurality of groups can include the same or a different number of semiconductor emitters. By way of example, at least one trench may be situated between all adjacent semiconductor emitters. In the case of a matrixlike arrangement of the semiconductor emitters, the trenches may assume a latticelike arrangement, for example.

Step (iii) encompasses the fact that, by the covering with the dielectric material, the trenches are also filled by the dielectric material. The dielectric material brings about an electrical insulation of the previously exposed side having the electrical connections. A height of the dielectric material is adjustable in a simple manner.

The dielectric material may be transparent or specularly or diffusely reflective. It may include, in particular, diffusely reflective material such as titanium oxide and/or aluminum oxide or other diffusely reflective material. The reflective material may be embedded as particles, e.g. in powder form, into a matrix material or basic material or be distributed therein. The matrix material or basic material may be or include e.g. silicone or epoxy resin.

Leading or producing the electrical lines through the dielectric material to the electrical connections of the semiconductor emitters (also referred to as electrical "contacting") in step (iv) may encompass the fact that the dielectric material is firstly opened in the region of the electrical connections and then the opened region is filled with electrically conductive material. The process of opening may take place e.g. mechanically (e.g. by drilling), by laser ablation or lithographically. The process of filling with the electrically conductive material may take place for example by means of a metal deposition and, if appropriate, a subsequent electroplating or by means of a printing method (e.g. a paste printing).

In one development, at least some of the electrical lines, on the surface facing away from the semiconductor emitters, are formed as "contact pads" in order to facilitate an electrical contacting. The contact pads may be formed in particular as soldering locations.

In step (v), in particular all the trenches may be severed. The parts singulated by this step are referred to hereinafter as "packages". The packages may include one semiconductor emitter ("single-chip package") or a plurality of semiconductor emitters ("multi-chip package"). If a plurality of semiconductor emitters are present, they may be accommodated in a common housing formed by the dielectric material. The severing may be achieved e.g. by means of sawing, cutting, laser ablation or a lithographic process. In particular, sides of the filled trenches remain in this case in order to form side walls of the housing of the lighting device.

In one configuration, the semiconductor emitters are fitted on a carrier and the carrier is removed after embedding into the filling material and before introducing the trenches. This enables a particularly simple arrangement and handling of the semiconductor emitters. Moreover, applying the filling compound is facilitated since the carrier serves as an interface or boundary layer for the light-transmissive filling compound.

Said carrier may be referred to hereinafter as "temporary carrier" or "sacrificial carrier", without restricting the generality.

The temporary carrier may be e.g. an adhesive film on which the semiconductor emitters are adhesively bonded by their underside.

In one development, the light-transmissive filling compound can be applied by potting (also referred to as "molding"), by injection molding, by printing (e.g. screen printing or stencil printing), etc., in particular to the semiconductor emitters and the exposed area of the temporary carrier. The temporary carrier can be removed for example after the light-transmissive filling compound has been solidified.

In another configuration, the trenches are introduced into the light-transmissive filling compound by a mechanical material removal. This may be implementable particularly simply. In particular, a cross-sectional shape of the trenches can be defined particularly simply by a choice of a shape of a removal tool.

In one development thereof, the trenches are introduced by sawing. The cross-sectional shape can be influenced for example by means of a cross-sectional shape of a saw blade (e.g. the angle and/or end face length thereof). The introduction of the sawing can then also be regarded as an incipient sawing of the light-transmissive filling compound. Any other suitable cutting disk may also be used instead of a saw blade.

In a further configuration, the trenches are introduced into the light-transmissive filling compound by laser ablation. This avoids high mechanical loadings. A cross-sectional shape of the trenches may be defined for example by a choice of the focal point and/or by beam shaping.

In yet another configuration, the trenches are introduced into the light-transmissive filling compound by an etching process. For the etching process, the side having the electrical connections may be protected by e.g. a mask, for example lithographically.

In one configuration, furthermore, the dielectric material is an optically reflective material. An efficiency of coupling out light can be increased as a result. In particular, a reflectivity may be more than 90%, in particular more than 95%. In this case, in particular, the dielectric material may include titanium oxide and/or aluminum oxide, e.g. as particles embedded into a matrix material such as silicone or epoxy resin.

However, the dielectric material is not restricted in principle and may be or include e.g. photoresist or potting material.

A side of the dielectric material facing away from the semiconductor emitters may be planar, in particular, which facilitates the further processing thereof.

In one configuration, moreover, the dielectric material is applied by means of a printing method. The printing method may include for example stencil printing or screen printing. In particular, blade coating may be used.

In another configuration, moreover, the dielectric material is applied by means of potting, dispensing or jetting.

The object is also achieved by means of a lighting device including at least one semiconductor emitter, wherein the lighting device has been produced by means of a method as described above. This lighting device can be configured analogously to the method and has the same advantages.

The lighting device may include, in particular, a shell-shaped reflector which is shaped from the dielectric material and at the base of which the at least one semiconductor emitter is arranged, wherein the shell-shaped reflector is filled with the light-transmissive potting compound. In other words, a separate carrier for the at least one semiconductor emitter can be dispensed with.

The lighting device may thus include one or a plurality of semiconductor emitters.

This lighting device may, if appropriate together with further lighting devices produced in this way, constitute a part of a lighting module, of a so-called "light engine", of a luminaire and/or of a lighting system.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
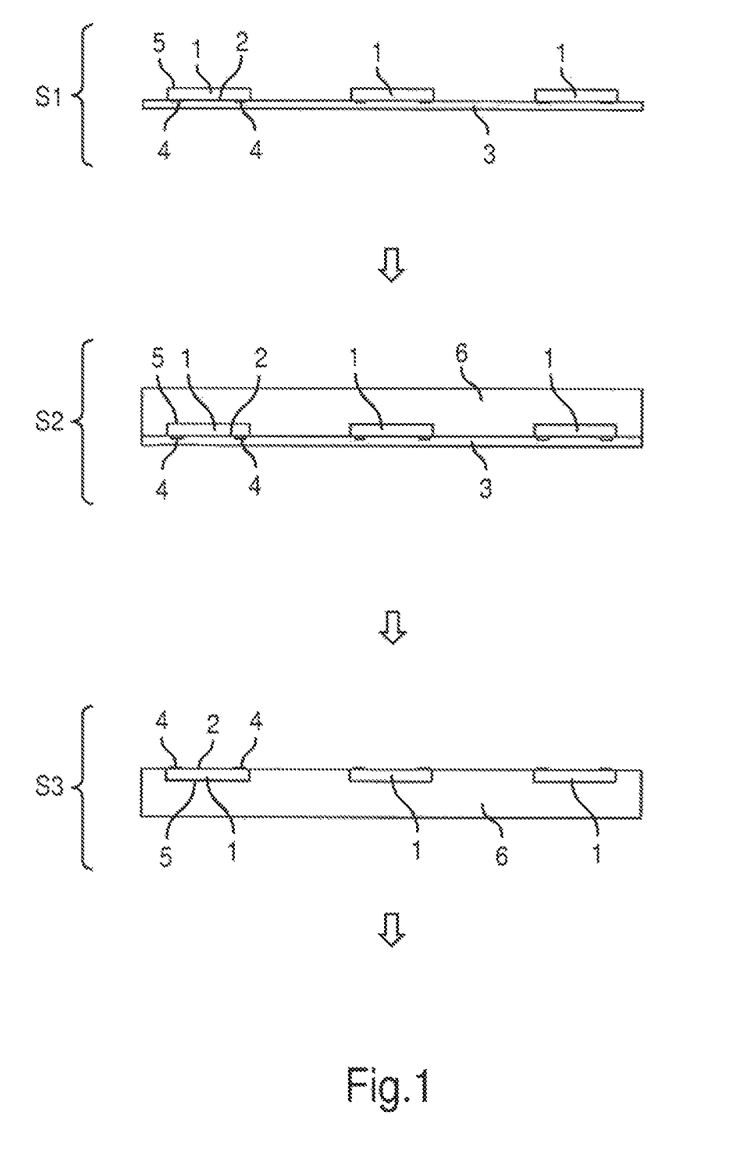
FIGS. 1 to 3 show different method steps of a method in accordance with one embodiment.

FIG. 1 shows method steps S1 to S3 of one possible method.

In a first method step S1, LED chips 1 are applied, e.g. adhesively bonded, with their underside 2 directed downward, on a carrier 3 in the form of e.g. an adhesive film. In each case two electrical chip contacts 4 projecting slightly above the area surrounding them are situated on the underside 2 of the LED chips 1. The LED chips 1 can emit for example blue light as their primary light. In one variant, they can be embodied as volume emitters which emit their primary light from practically all surfaces. In a second variant, the LED chips 1 can emit their primary light in particular from their top side 5 facing away from the underside. Such LED chips 1 are also referred to as surface emitters and can be present for example as so-called "thin GaN" chips.

In a subsequent second method step S2, light-transmissive filling compound in the form of potting compound 6 is applied on the LED chips 1 and the carrier 3, such that the LED chips 1 are embedded into the light-transmissive potting compound 6 outside their underside 2 or outside their chip contacts 4. The light-transmissive potting compound 6 is thus situated above the LED chips 1 and covers them. The potting compound 6 here includes at least one phosphor which converts the blue primary light of the LED chips 1 partly into yellow light. As a result, blue-yellow or white mixed light emerges at the side of the potting compound 6 facing away from the LED chips 1. Method step S2 may also include curing the potting compound 6, e.g. without elevated temperature or alternatively in a furnace or by UV curing.

In a subsequent third method step S3, the carrier 3 is removed, e.g. by pulling off the adhesive film. As a result, the chip contacts 4 are exposed, in particular protrude from the potting compound 6. In addition, the combination of potting compound 6 and the LED chips 1 is turned upside down or "flipped" for further processing, such that the underside 2 of the LED chips 1 now faces upward.

Figure 2:
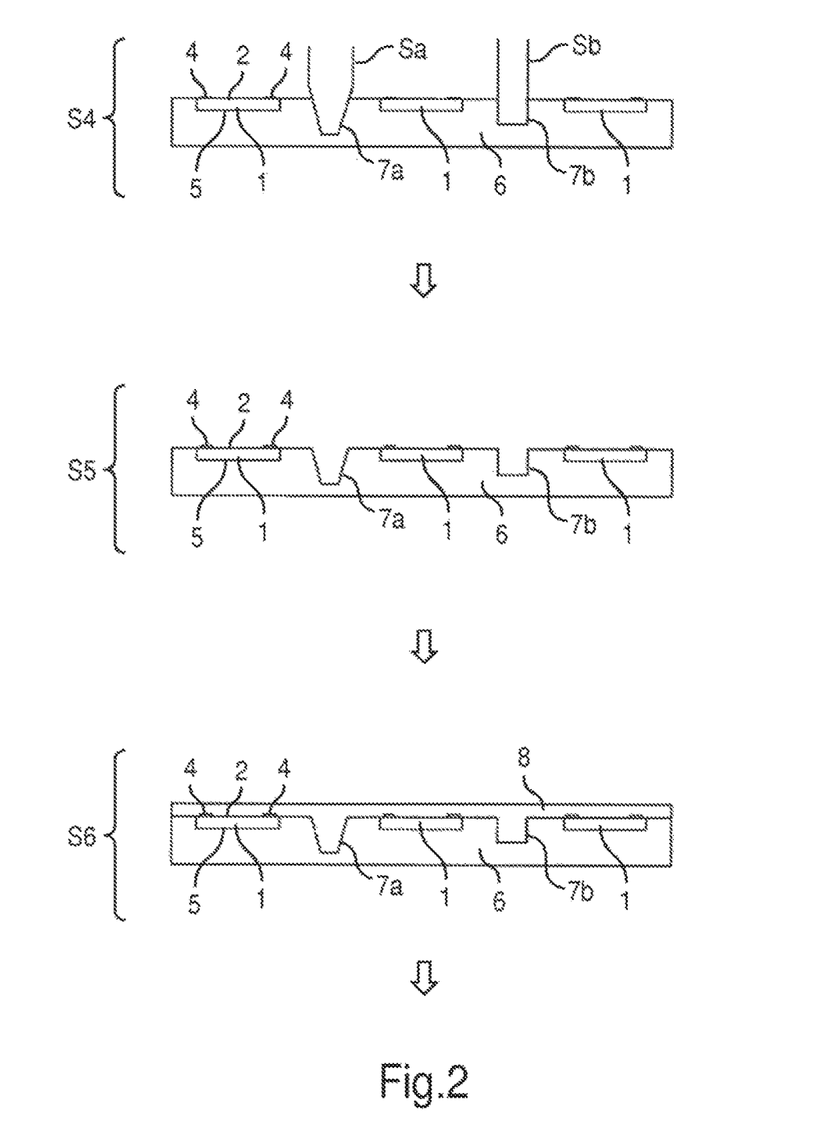

FIG. 2 shows method steps S4 to S6 of the method.

In a fourth method step S4, rectilinear trenches 7a, 7b between LED chips 1 are introduced into the potting compound 6. This is done here by cutting into the potting compound 6 over the entire length and/or width of the potting compound 6, e.g. by incipient sawing. The trenches 7a, 7b for the case of incipient sawing can also be referred to as "sawing trenches". A cross-sectional shape of the trenches 7a and 7b is determined by a cross-sectional shape of the cutting disks Sa and Sb, respectively, used for this purpose. The cutting disk Sa used here for producing a first trench 7a has a frustoconical basic shape in the region of the material removal of the potting compound 6. By contrast, the cutting disk Sb used for producing the second trench 7b has a rectangular basic shape in the region of the removal of the potting compound 6. The cutting disks Sa and Sb can be embodied e.g. as diamond-tipped grinding blades.

After the removal of the cutting disks Sa and Sb in a subsequent fifth method step S5, the first trench 7a having its frustoconical cross section and the second trench 7b having its rectangular cross section remain here, purely by way of example.

In a subsequent sixth method step S6, a top side of the here upper side of the potting compound 6 provided with the LED chips 1 and the trenches 7a, 7b is covered with a dielectric potting compound 8. The dielectric potting compound 8 may be e.g. silicone admixed with white pigment such as titanium oxide powder and/or aluminum oxide powder. The dielectric potting compound 8 is thus highly reflective, e.g. with a reflectivity of 90% or more. By means of the dielectric potting compound 8, the LED chips 1 and the chip contacts 4 thereof are also electrically insulated from one another. The dielectric potting compound 8 may be applied for example by a printing method, potting, dispensing or jetting. By way of example, a height of the dielectric potting compound 8 above the light-transmissive potting compound 6 can be set by the quantity of the applied volume. The trenches 7a, 7b are also filled with the dielectric potting compound 8.

Figure 3:
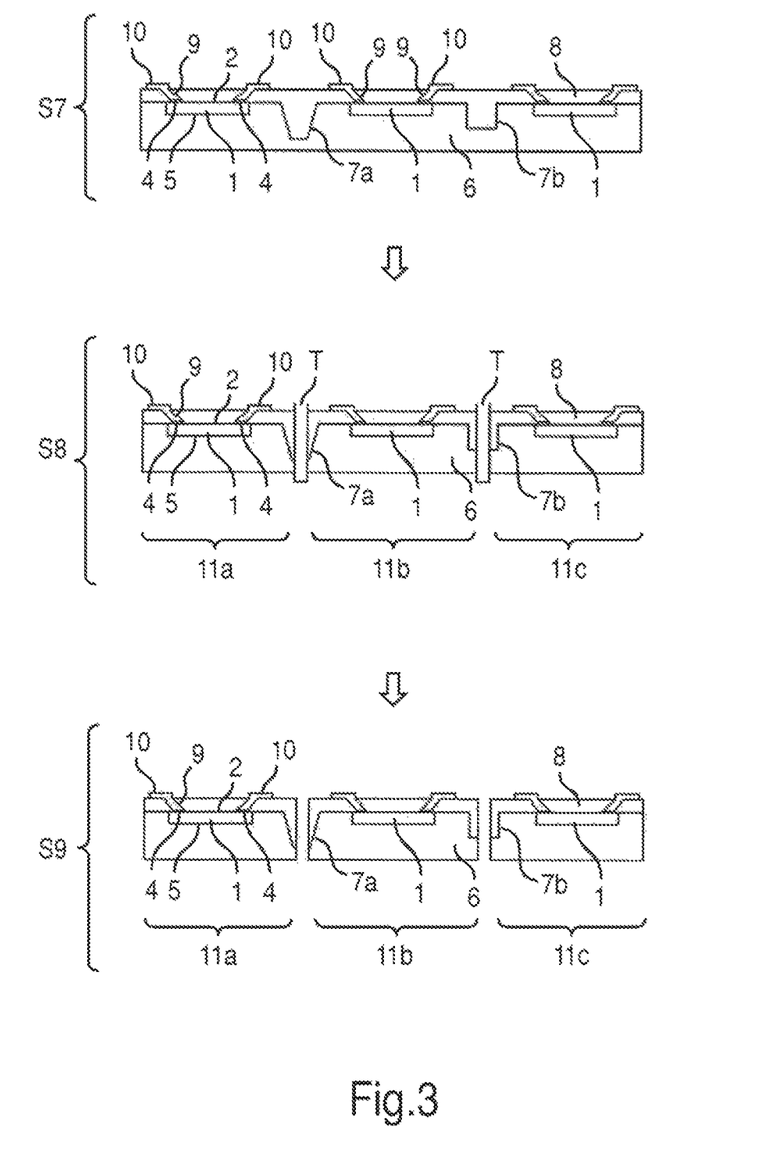

FIG. 3 shows method steps S7 to S9 of the method.

In a seventh method step S7, electrical lines 9 or contactings or plated-through holes (vias) are produced from the free, here upper area of the dielectric potting compound 8 through the dielectric potting compound 8 to the chip contacts 4 arranged on the opposite side, e.g. by opening the dielectric potting compound 8 and subsequent filling with electrically conductive compound, e.g. paste. On the upper, free surface of the dielectric potting compound 8, the electrical lines 9 are configured as contact zones 10.

In a subsequent eighth method step S8, the trenches 7a, 7b filled with the dielectric potting compound 8 are separated, e.g. by sawing through using a thin cutting disk T. The segments thus singulated are referred to as LED packages 11a, 11b and 11c. In this case, partial regions of the dielectric potting compound 8 remain here on both sides of the trenches 7a, 7b and serve as reflective side walls of the LED packages 11a, 11b and 11c.

The singulated LED packages 11a, 11b and 11c are shown separated in step S9. They are now ready for mounting, including mechanical and/or electrical contacting. The mounting can include e.g. incorporation into a module, a light engine, a luminaire and/or into a lighting system.

Figure 4A:
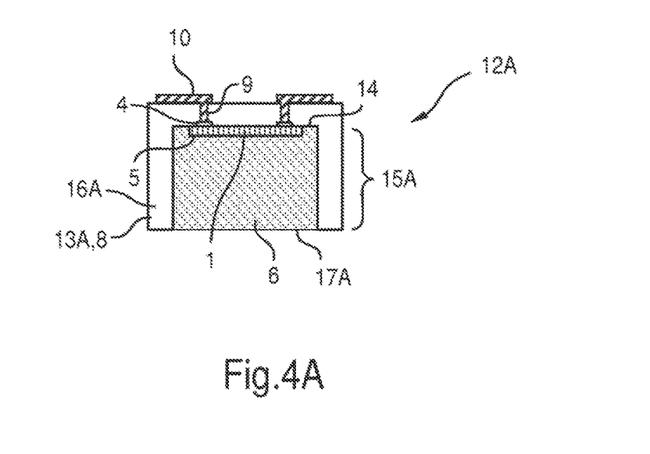
FIGS. 4A to 4E show different lighting devices producible by the method, as a sectional illustration in side view.

FIG. 4A shows, as a sectional illustration in side view, a lighting device in the form of an LED package 12A which has been produced e.g. in accordance with method steps S1 to S9. The LED package 12A includes a shell-shaped reflector 13A consisting of the dielectric material 8. Said reflector may have e.g. a box-shaped basic shape having a base 14 and side walls 15A and 16A proceeding therefrom. A front side wall possibly present in front of the plane of the drawing and a rear side wall possibly present behind the plane of the drawing are not shown. The side walls 15A, 16A can extend around the base 14 in particular in a closed fashion.

The at least one LED chip 1 is fitted on the base 14, specifically such that its area(s) emitting the primary light is(are) directed into the cavity of the reflector 13A formed by the base 14 and the side walls 15A and 16A. The cavity is filled with the light-transmissive potting compound 6 containing wavelength-converting phosphor, such that white mixed light can be emitted at the free surface thereof, serving as a light emission area 17A.

Primary light emitted by the at least one LED chip 1 may pass directly through the light-transmissive potting compound 6 to the light emission area 17A or may previously have been diffusely reflected singularly or multiply at the reflective dielectric material 8, in particular at an inner side of the side walls 15A and/or 16A.

The at least one LED chip 1 can be supplied with current via the lines 9. In this regard, a driver (not illustrated) can be soldered and/or adhesively bonded onto the contact zones 10, specifically directly or via a circuit board, etc.

The side walls 15A and 16A here are of the same cross-sectional shape, namely rectangular, such that their inner sides project perpendicularly from the base 14. A configuration of the light emission area 17A such that it is areally flush with the edges of the side walls 15A and 16A can be achieved for example by material removal of the light-transmissive potting compound 6.

Figure 4B:
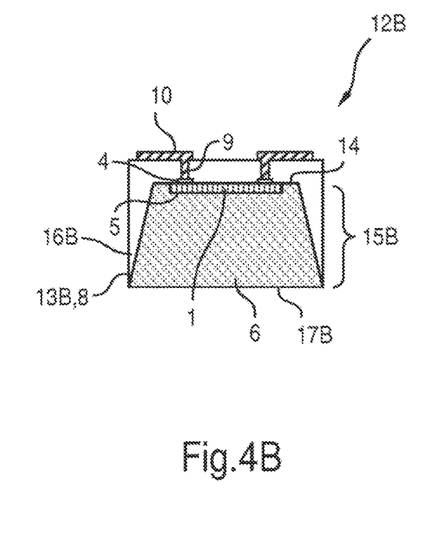

FIG. 4B shows, as a sectional illustration in side view, a lighting device in the form of an LED package 12B that has been produced e.g. in accordance with method steps S1 to S9. The LED package 12B includes a shell-shaped reflector 13B consisting of the dielectric material 8. The side walls 15B and 16B of the reflector 13B or the reflective inner sides thereof are likewise of the same cross-sectional shape, but now are shaped such that their inner sides project obliquely from the base 14. As a result, the reflector 13B widens from its base 14 as far as the light emission area 17B. In this regard, a different emission pattern in comparison with the LED package 12A can be set. A configuration of the light emission area 17B such that it is areally flush with the edges of the side walls 15B and 16B is provided here as well. The arrangement and electrical contacting of the at least one LED chip 1 is similar to the LED package 12A.

Figure 4C:
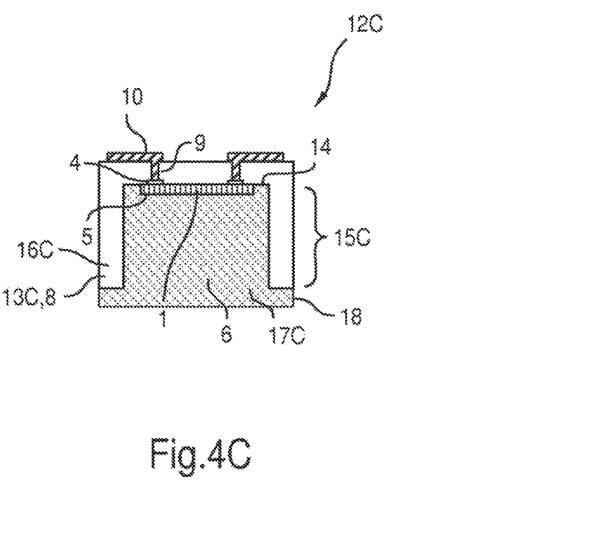

FIG. 4C shows, as a sectional illustration in side view, a lighting device in the form of an LED package 12C that has been produced e.g. in accordance with method steps S1 to S9. The LED package 12C is constructed similarly to the LED package 12A and includes a shell-shaped reflector 13C consisting of the dielectric material 8. Here, too, the side walls 15C and 16C of the reflector 13B are of the same cross-sectional shape, namely rectangular, such that their inner sides project perpendicularly from the base 14. However, then the light-transmissive potting compound 6 projects above the reflector 13C or the free edges thereof. Consequently, a configuration of a light emission area 17C such that it is areally flush with the edges of the side walls 15C and 16C downward is no longer provided. As a result, the light emission area 17C has a lateral strip 18, which amplifies a laterally directed light emission through the light emission area 17C. The arrangement and electrical contacting of the at least one LED chip 1 is similar to the LED package 12A.

In a further embodiment (not illustrated), it is possible to produce a lighting device in the form of an LED package which has a shape similar to the LED package 12C but, instead of the rectangular side walls 15C and 16C, now has side walls having reflective inner sides which project obliquely from the base 14, e.g. similarly to the side walls 15B and 16B.

Figure 4D:
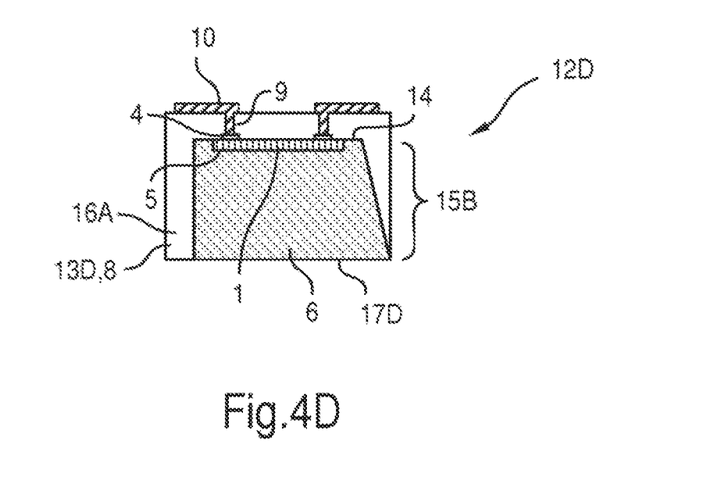

FIG. 4D shows, as a sectional illustration in side view, a lighting device in the form of an LED package 12D that has been produced e.g. in accordance with method steps S1 to S9. The LED package 12D may be regarded as a combination of the LED packages 12A and 12B in which the side walls 15B and 16A of the reflective housing or reflector 13D are now embodied as in the case of the LED packages 12B and 12A, respectively. A configuration of a light emission area 17D such that it is areally flush with the edges of both side walls 15A and 16B is provided.

Figure 4E:
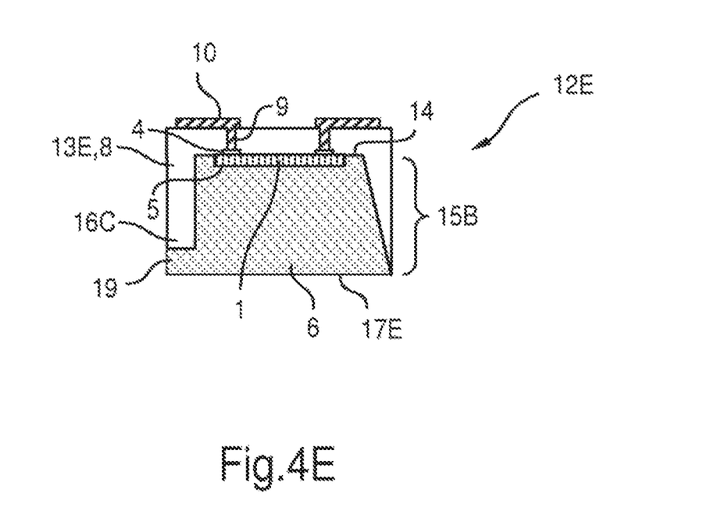

FIG. 4E shows, as a sectional illustration in side view, a lighting device in the form of an LED package 12E that has been produced e.g. in accordance with method steps S1 to S9. The LED package 12E may be regarded as a combination of the LED packages 12B and 12C in which the side walls 15B and 16C of the reflector 13E are now embodied as in the case of the LED packages 12B and 12C, respectively. An areally flush configuration of the light-transmissive potting compound 6 is provided only in respect of the edge of the oblique side wall 15B. In the case of the other side wall 16C, the light-transmissive potting compound 6 projects downward in front of the edge, such that a light emission area 17E has a lateral strip 19 in the region of the side wall 16C.

Generally, the side walls of the reflector can be circumferentially closed. They can alternatively have gaps.

The reflector may also be regarded or referred to as a reflective housing.

Generally, "a(n)", "one", etc. can be understood to mean a singular or a plural, in particular in the sense of "at least one" or "one or a plurality", etc. as long as this is not explicitly excluded, e.g. by the expression "exactly one", etc.

Moreover, a numerical indication can encompass exactly the indicated number and also a customary tolerance range, as long as this is not explicitly excluded.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing a lighting device comprising:
    embedding a plurality of semiconductor emitters arranged alongside one another in a light-transmissive filling compound apart from a top side having their electrical connections so that a plurality of sidewalls and a bottom side of the each of the plurality of semiconductor emitters are covered by the light-transmissive filling compound, wherein the bottom side of each semiconductor emitter is opposite to the top side,
    introducing trenches into the light-transmissive filling compound at the side having the electrical connections between at least two semiconductor emitters, wherein the plurality of sidewalls and the bottom surface of each of the at least two semiconductor emitters remain covered by the light-transmissive filling compound,
    covering the side of the light-transmissive filling compound having the electrical connections, including the electrical connections, with a dielectric material, comprising filling and overfilling the trenches with the dielectric material,
    after covering the side of the light-transmissive filling compound, leading electrical lines through the dielectric material to the electrical connections, and
    severing one or more of the trenches.

2. The method as claimed in claim 1, wherein the semiconductor emitters are fitted alongside one another on a carrier and the carrier is removed after embedding into the light-transmissive filling compound and before introducing the trenches.

3. The method as claimed in claim 2, wherein the carrier is an adhesive film.

4. The method as claimed in claim 1, wherein the trenches are introduced into the light-transmissive filling compound by a mechanical material removal, by a laser ablation or by an etching process.

5. The method as claimed in claim 4, wherein the mechanical material removal is sawing.

6. The method as claimed in claim 1, wherein the dielectric material is an optically reflective material.

7. The method as claimed in claim 1, wherein the dielectric material is applied by a printing method.

8. The method as claimed in claim 1, wherein the dielectric material is applied by potting.

9. The method as claimed in claim 1, wherein the semiconductor emitters are LED chips.

10. The method as claimed in claim 1, wherein at least one trench has a frustoconical shape.

11. The method as claimed in claim 1, wherein filling and overfilling the trenches with the dielectric material provides electrical insulation to the top side of each the at least two semiconductor emitters.

12. The method as claimed in claim 1, wherein leading electrical lines through the dielectric material to the electrical connections comprises forming a plurality of openings in the dielectric material and subsequently filling the plurality of openings with electrically conductive compound.

13. The method as claimed in claim 1, wherein the severing forms a plurality of singulated packages.

14. The method as claimed in claim 13, wherein one or more sidewalls of the singulated packages is entirely of the dielectric material.

15. The method as claimed in claim 1, wherein the dielectric material used in the filling and overfilling does not include electrically conductive material.

16. A lighting device comprising:
    a plurality of semiconductor emitters, each of said emitters having electrical connections on a top side thereof;
    a light-transmissive filling compound embedding the plurality of semiconductor emitters apart from the top side;
    trenches in the light-transmissive filling compound at the side and between at least two semiconductor emitters so that a plurality of sidewalls and a bottom side of the each of the plurality of semiconductor emitters are covered by the light-transmissive filling compound, wherein the bottom side of each semiconductor emitter is opposite to the top side;
    dielectric material covering the light-transmissive filling compound including the electrical connections at the side so that the trenches are at least completely filled with the dielectric material; and
    electrical lines leading through the dielectric material to the electrical connections;
    wherein at one or more of the trenches are severed.

17. The lighting device as claimed in claim 16, further comprising a shell-shaped reflector composed of the dielectric material, at the base of which at least one of the plurality of semiconductor emitters is arranged, wherein the shell-shaped reflector is filled with the light-transmissive potting compound.

18. The lighting device as claimed in claim 16, wherein the carrier is an adhesive film.

19. The lighting device as claimed in claim 16, wherein the dielectric material is an optically reflective material.

20. The lighting device as claimed in claim 16, wherein the semiconductor emitters are LED chips.

* * * * *

UNITED STATES PATENT AND TRADEMARK OFFICE
CERTIFICATE OF CORRECTION

PATENT NO. : 9,966,516 B2
APPLICATION NO. : 15/503028
DATED : May 8, 2018
INVENTOR(S) : Philipp Schlosser et al.

Page 1 of 1

It is certified that error appears in the above-identified patent and that said Letters Patent is hereby corrected as shown below:

In the Claims

Column 10, Line 55: Please delete the word "the" between the words "a" and "base".

Signed and Sealed this
Twenty-fifth Day of September, 2018

Andrei Iancu
*Director of the United States Patent and Trademark Office*